United States Patent
Quon (10) Patent No.: US 6,885,153 B2
(45) Date of Patent: Apr. 26, 2005

(54) PLASMA PROCESSING APPARATUS AND METHOD

(75) Inventor: Bill H Quon, Brea, CA (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 10/721,413

(22) Filed: Nov. 26, 2003

(65) Prior Publication Data

US 2004/0112536 A1 Jun. 17, 2004

Related U.S. Application Data

(63) Continuation of application No. PCT/US02/13782, filed on May 2, 2002.
(60) Provisional application No. 60/293,542, filed on May 29, 2001.

(51) Int. Cl.[7] .................................................. H05H 1/46
(52) U.S. Cl. ............................. 315/111.31; 315/111.21; 118/723 I
(58) Field of Search ......................... 315/111.21, 111.51, 315/111.81, 111.31; 118/723 E, 723 I, 723 IR; 156/345, 345 C; 204/298.32

(56) References Cited

U.S. PATENT DOCUMENTS

| 4,602,981 A | | 7/1986 | Chen et al. .................... 438/17 |
| 5,415,718 A | | 5/1995 | Ohmi et al. ............ 156/345.26 |
| 5,433,813 A | * | 7/1995 | Kuwabara .............. 156/345.27 |
| 5,849,136 A | * | 12/1998 | Mintz et al. ........... 156/345.44 |
| 6,252,354 B1 | * | 6/2001 | Collins et al. ........... 315/111.51 |

FOREIGN PATENT DOCUMENTS

| EP | 0 598 128 A1 | 5/1994 |
| TW | 308778 | 2/1996 |

\* cited by examiner

*Primary Examiner*—Don Wong
*Assistant Examiner*—Jimmy Vu
(74) *Attorney, Agent, or Firm*—Pillsbury Winthrop LLP (57) ABSTRACT

A method for determining the potential of a plasma in a processing chamber includes determining voltages of respective plasma engaging surfaces of at least two plasma generating electrodes disposed within the processing chamber and determining the plasma potential by comparing the determined voltages and equating the highest determined voltage to the plasma potential.

23 Claims, 3 Drawing Sheets

PLASMA PROCESSING APPARATUS AND METHOD

This is a continuation application of International Application No. PCT/US02/13782, filed May 2, 2002, and, in turn, claims the benefit of U.S. Provisional Application No. 60/293,542, filed May 29, 2001, the contents of both of which are incorporated herein by reference.

FIELD OF THE INVENTION

The present invention relates to plasma processing systems and more particularly to a plasma processing system for deposition or etching of a workpiece. The invention is more specifically directed to a method and apparatus for determining and controlling the ion energy of plasma ions impinging on the surface of a workpiece.

BACKGROUND OF THE INVENTION

A plasma is a collection of charged particles that may be used to remove material from or deposit material on a workpiece. Plasmas are used in the manufacture of integrated circuit (IC) devices, flat panel displays and other products. Plasmas may be used, for example, to etch (i.e., remove) material from or to sputter (i.e., deposit) material onto a workpiece in the form of, for example, a semiconductor substrate during IC fabrication.

A plasma may be formed by introducing a low pressure process gas into a plasma chamber and then applying a radio frequency (RF) power signal from a RF power source to the gas to ionize the gas particles. The RF source may be coupled to the plasma through a capacitance, through an inductance, or through both a capacitance and an inductance. When capacitive coupling is used, the plasma processing system may include one or more RF power sources, each of which operates at a selected frequency and each of which is electrically communicated to the process gas through an associated electrode.

A plasma chamber may include, for example, a first or chuck electrode that supports the workpiece within the chamber and a second electrode that together with the first electrode form a parallel plate capacitively coupled plasma (CCP) source. The chuck electrode (and therefore the workpiece) is appropriately electrically biased so that ions generated in the plasma chamber flow toward and strike the substrate for etching or deposition. To better control the processing of the workpiece, it would be advantageous to be able to determine the energy of the ions striking the workpiece.

SUMMARY OF THE INVENTION

The present invention includes methods and apparatus for determining ion energy and the ion energy distribution function (or IEDF) to better control the processing of a workpiece with a plasma.

DETAILED DESCRIPTION OF THE INVENTION

Figure 1:
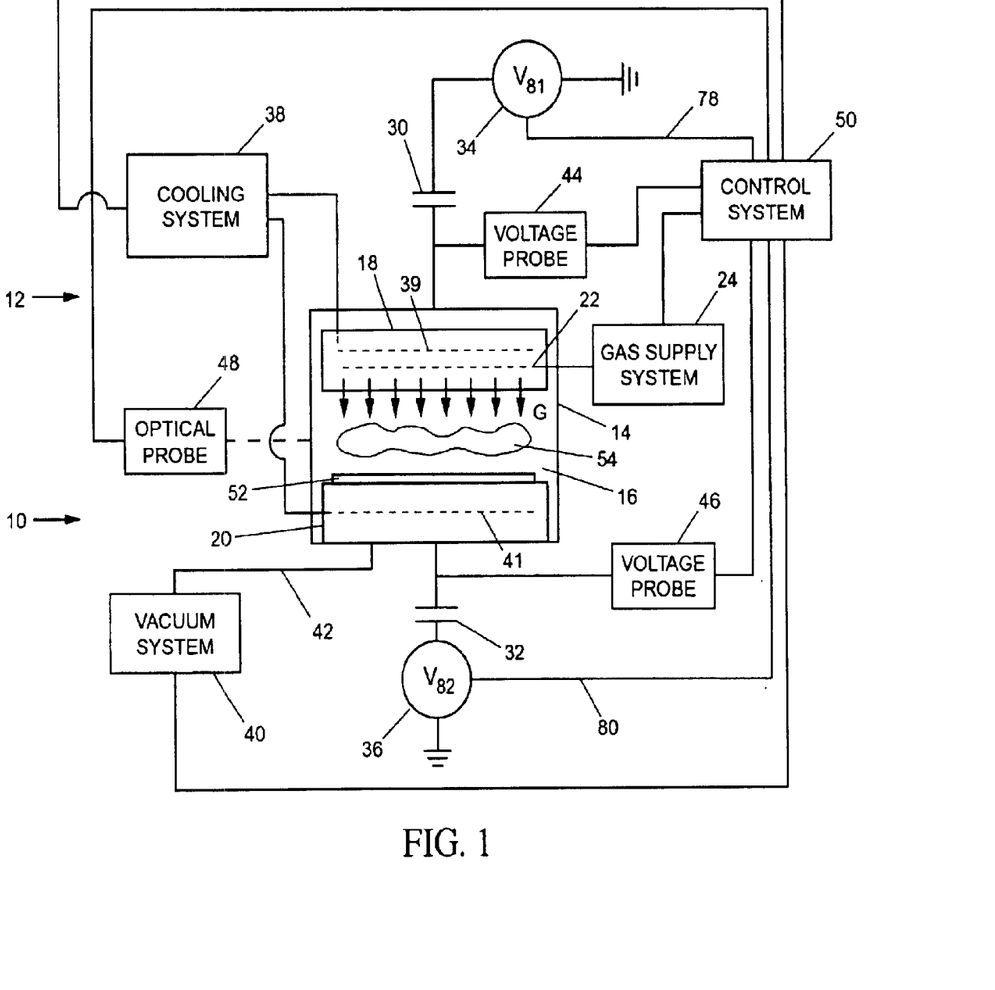
FIG. 1 is a schematic diagram of an example plasma processing system for illustrating the present invention, the plasma processing system showing a workpiece and a plasma within a plasma processing chamber of a plasma processing apparatus.

FIG. 1 shows a schematic representation of an example of a plasma processing apparatus 10 of a plasma processing system 12. The plasma processing apparatus 10 includes a plasma chamber 14, which provides an interior region 16 for containing and supporting a plasma. At least one electrode assembly can be coupled to the plasma chamber 14. For example, two electrodes, as shown in FIG. 1, may be mounted within the chamber 14 in plasma generating relation to one another and to a process gas within the chamber 14. In FIG. 1, the electrodes are energized to generate a plasma from a process gas within the chamber 14. To facilitate the description of the invention, only two electrode assemblies are included in the apparatus 10. Specifically, a first electrode assembly 18 is mounted on a first side of the chamber 14 (in an upper portion of the interior 16 of the chamber 14 in the example apparatus 10). A second electrode assembly in the form of a chuck electrode assembly 20 is mounted on a second side of the chamber 14 opposite the first side of the chamber 14 (in a lower portion of the chamber interior 16 in the example apparatus 10) in a position spaced from the first electrode assembly 18.

The first electrode assembly 18 may include a plurality of electrode segments, each segment being electrically isolated from the other segments and each segment being independently powered by an associated RF power source and independently supplied with a selected processing gas for transmission at a predetermined rate into the interior of the plasma chamber. To facilitate the description of the present invention, however, the first electrode assembly 18 is in the form of a single showerhead-type electrode. The first electrode assembly 18 includes an inner chamber 22 (indicated schematically by a broken line in FIG. 1) that is in pneumatic or fluidic communication with a gas supply system 24 through a gas supply line. A selected gas may be supplied to the electrode assembly 18 to purge the chamber 14, for example, or to serve as a process gas (or source gas) for plasma formation in the chamber interior 16. The process gas is transmitted from the chamber 22 into the interior 16 of the plasma chamber through a plurality of gas ports (not shown). The flow of gas through the ports of the first electrode is indicated by a series of directional arrows G.

The first and second electrode assemblies 18, 20 are electrically communicated through associated capacitors 30, 32 to respective RF power sources 34, 36 which provide voltage signals $V_{B1}$, $V_{B2}$, respectively, to the associated electrodes 18, 20. Moreover, impedance match networks (not shown) can be inserted between respective RF power sources 34, 36 and respective blocking capacitors 30, 32 in order to maximize power transfer to plasma through respective electrode assemblies 18, 20.

Each electrode assembly 18, 20 may be independently cooled by a fluid that circulates from a cooling system 38 through a fluid chamber 39, 41 (indicated by a broken line) in each electrode assembly 18, 20, respectively, and then back to the cooling system. The plasma processing apparatus 10 further includes a vacuum system 40 in pneumatic or fluidic communication with the plasma chamber 16 through a vacuum line 42. The plasma processing apparatus 10 also includes a pair of voltage probes 44, 46 in the form of a pair of electrodes capacitively coupled to the transmission lines between the associated RF power sources 34, 36, respectively, and the associated electrode assembly 18, 20, respectively. The plasma processing apparatus 10 includes an optical probe 48 for determining plasma characteristics and conditions based on spectral and optical properties of the plasma.

A control system 50 of the plasma processing apparatus 10 is electrically communicated to various components of the apparatus 10 to monitor and/or control the same. The control system 50 is in electrical communication with and may be programmed to control the operation of the gas supply system 24, vacuum system 40, the cooling system 38, the voltage probes 44, 46, the optical probe 48 and each RF power source 34, 36. The control system 50 may send control signals to and receive input signals (feedback signals, for example) from the probes 44, 46, 48 and systems 24, 34, 36, 38, 40. The control system 50 may monitor and control the plasma processing of a workpiece as described below when the operation of the plasma processing system 12 is discussed. The control system 50 may be provided by a computer system that includes a processor, computer memory accessible by the processor (where the memory is suitable for storing instructions and data and may include, for example, primary memory such as random access memory and secondary memory such as a disk drive) and data input and output capability communicated to the processor.

The methods of the present invention can be illustrated with the plasma processing system 12. The operation of the plasma processing system 12 can be understood with reference to FIG. 1. A workpiece 52 to be processed is placed on a support surface provided by the chuck assembly 20. The control system 50 activates the vacuum system 40 which lowers the pressure in the interior 16 of the plasma chamber 14 to a base pressure (typically $10^{-7}$ to $10^{-4}$ Torr) to assure vacuum integrity and cleanliness for the chamber, and then it is raised to a level suitable for forming a plasma and for processing the workpiece with the plasma (a suitable interior pressure may be, for example, in the range of from about 1 mTorr to about 1000 mTorr). In order to establish a suitable pressure in the chamber interior 16, the control system 50 activates the gas supply system 24 to supply a process gas through the gas inlet line to the chamber interior 16 at a prescribed process flow rate and the vacuum system 40 is throttled, if necessary, using a gate valve (not shown). The process gas may flow through ports in the first electrode assembly as indicated in FIG. 1 by arrows G.

The particular gas or gases included in the gas supply system depends on the particular plasma processing application. For plasma etching applications, for example, the gas supply system may supply chlorine, hydrogen-bromide, octafluorocyclobutane, or various other gaseous fluorocarbon compounds; for chemical vapor deposition applications, the system may supply silane, ammonia, tungsten-tetrachloride, titanium-tetrachloride, or like gases. A plasma may also be used in chemical vapor deposition (CVD) to form thin films of metals, semiconductors or insulators (that is, conducting, semiconducting or insulating materials) on a semiconductor wafer. Plasma-enhanced CVD uses the plasma to supply the required reaction energy for deposition of the desired materials.

The control system 50 then activates the RF power sources 34, 36 associated with the first and second electrode assemblies 18, 20. The RF power sources 34, 36 may provide voltages to the associated electrodes 18, 20 at selected frequencies. The control system 50 may independently control the RF power sources 34, 36 to adjust the frequency and/or amplitude of the voltage at which each source 34, 36 drives the associated electrode assembly 18, 20.

The RF power sources may be operated to convert the low-pressure process gas to a plasma. The power sources 34, 36 may be operated, for example, to cause an alternating electric field to be generated between the first and second electrodes 18, 20 which induces an electron flow between the electrodes 18, 20. Electrons, for example, are accelerated in this electric field and the flow of heated electrons in the field ionizes individual atoms and molecules of the process gas by transferring kinetic energy thereto through multiple collisions between the electrons and the gas atoms and molecules. This process creates a plasma 54 that is confined and supported within the chamber 14.

Each RF power source 34, 36 is independently controllable by the control system 50, as mentioned. Either power source may have a relatively low frequency (i.e., a frequency below 550 KHz), an intermediate frequency (i.e., a frequency around 13.56 MHz), or a relatively high frequency (i.e., a frequency in the microwave range, as, for example, around 2.45 GHz). In an example etch reactor, the RF power source 34 for the first electrode assembly 18 can be driven at a frequency of 60 MHz and the RF power source 36 for the second electrode assembly 20 can be driven at a frequency of 2 MHz. It is commonly accepted by those skilled in the art that the high frequency (i.e. 60 MHz) on the first electrode serves to affect a high plasma density (i.e. $10^{11}$ to $10^{12}$ cm$^{-3}$) whereas the second electrode more directly affects the ion energy at the substrate surface. In order to improve the performance of the aforementioned reactor, or more generally, a plasma processing device with one or more electrodes driven at one or more frequency, the control system 50 can be programmed and operated to determine either the ion energy or the ion energy distribution function (or IEDF) of the plasma ions striking the workpiece 52 over a voltage bias period.

In an alternate embodiment, at least one of the electrode assemblies 18, 20 can be electrically grounded. In an alternate embodiment, at least one of the electrode assemblies 18, 20 can be DC biased. In an alternate embodiment, at least one of the electrode assemblies 18, 20 can be coupled to more than one RF source, e.g. multi-frequency excitation.

When a RF voltage $V_{B2}$ is applied to the second electrode 20 (from a RF generator 36 through a blocking capacitor 32), it eventually establishes what is commonly referred to as a DC self-bias voltage on the substrate 52. During the formation of a DC self-bias voltage on the substrate, the substrate surface potential adjusts until the average electron and positive ion currents balance (or the net current is zero). For example, during the fraction of the RF cycle when the electrode voltage is positive, the electrode draws electron current and the plasma potential is perturbed upward. However, during the remaining fraction of the RF cycle when the electrode voltage becomes negative, electrons are repelled by the sheath and appreciable ion current is drawn to the electrode and the plasma potential is not significantly affected by the electrode voltage of the electrode supporting the workpiece. Therefore, relative to the plasma potential, the applied RF voltage shifts in the negative direction to form the relatively negative DC self-bias voltage.

In summary, when the voltage of the chuck electrode 20 is lower than the voltage of the plasma, positively charged plasma atoms/molecules (i.e. ions) near the workpiece 52 in the plasma 54 generated in the interior 16 of the chamber 14 are accelerated toward the workpiece 52. The ions striking the surface of the workpiece 52 can either form a deposit on the workpiece surface or etch material from the workpiece surface. Plasma ions are constantly being reformed in the interior 16 of the plasma chamber 14 to replenish the plasma supply.

The present invention relates to methods and apparatus for determining the time-dependent ion energy and the IEDF of the plasma ions striking the workpiece 52 using non-intrusive methods. Non-intrusive methods are methods that measure plasma characteristics such as plasma potential and current while reducing the affect on (or reducing changes in the conditions of) the plasma 54. The IEDF as used in the present application refers to the ion energy distribution function of the plasma particles striking the workpiece 52. The IEDF provides an indication of the characteristics of the energy of the plasma ions striking the workpiece 52. Knowing the IEDF provides better control of the processing of the workpiece 52.

The energy of the ions striking the workpiece 52 depends on the potential Vp of the plasma 54 and the bias voltage on the chuck electrode 20 that supports the workpiece 52. The plasma potential Vp is determined by the so-called ambipolar diffusion process. In a system where the electron and ion loss are changing in time, the plasma potential is continuously modified to maintain charge and current neutrality in each unit plasma volume. Because the bias voltages on the electrodes can strongly affect the electron and ion current flowing to these electrodes, the bias voltage will cause the plasma potential to change. Thus, it is desirable to be able to monitor changes in the plasma potential, Vp, over time.

The first and the second electrode voltages $V_{B1}$, $V_{B2}$ are both functions of time and are readily measured using known methods and instrumentation, such as high voltage probes and waveform digitizers. The first and the second electrode voltages can be measured using, for example, probe 44, 46. The electrode voltages $V_{B1}$ and $V_{B2}$ can be simple periodic functions of time, or they can contain harmonics of the applied fundamental frequencies. An example voltage probe is described in detail in pending U.S. application 60/259,862 (filed on Jan. 8, 2001), and it is incorporated in its entirety herein by reference. The RF voltages $V_{B1}$, $V_{B2}$ applied to the first and second electrode assemblies 18, 20 are typically periodic functions of time, but this is not required by the present invention. That is, both the time-dependent ion energy and the IEDF can be determined according to the invention in instances in which the voltages of any of the electrodes and/or of the plasma are aperiodic (i.e., not periodic).

According to the present invention, the plasma potential Vp can be determined from the measured electrode voltages. At any particular instant of time, the electrode with the most positive bias voltage will attract a large electron current to that electrode. The magnitude of this electron current must be many times larger than the average ion current attracted to the other electrode. As the result of the imbalance of the electron and ion current, the plasma potential will change to a more positive voltage until the plasma potential becomes the same as the most positive bias voltage. Thus as a general rule, the plasma potential at any particular instant in time is equal to the highest potential observed on any of the surfaces that are interacting with (i.e., that are substantially in contact with) the plasma at that particular instant. For example, a surface having substantial contact with the plasma can be defined as one whose surface area $A_s$ in contact with the plasma exceeds 20% of the total surface area $A_{tot}$ of surfaces in contact with the plasma divided by the number of surfaces $N_s$ with substantial contact with the plasma, viz. $A_s > 0.2$ ($A_{tot}/N_s$). Surfaces that are substantially in contact with the plasma can be, for example, a biased electrode assembly (AC or DC biased), a grounded electrode assembly or a grounded plasma chamber wall. A surface substantially in contact with the plasma can be referred to as a plasma engaging surface. With reference to the example plasma processing system shown in FIG. 1, the only surfaces substantially in contact with the plasma are surfaces of the first and second electrode assemblies 18, 20. Therefore, $V_P$ may be estimated to be equal to the more positive voltage of the two measured voltages, $V_{B1}$ and $V_{B2}$, at each instant in time. The method of the present invention therefore includes simultaneously measuring the RF voltages on all electrodes in the chamber (the first electrode assembly 18 and the chuck electrode assembly 20 in the present example) using voltage probes 44, 46 external to the processing plasma.

As described in the theory for the Langmuir probe in the above incorporated reference, for the probe potential at any voltage between the floating potential and the plasma potential, the electron current is in the transition region between the ion saturation current and the electron saturation current. The voltage difference between these two voltages is $\ln(M/2\pi m)T_e$, where M is the ion mass, m is the electron mass, $T_e$ is the electron temperature in units of electron volts, "ln" stands for the natural logarithm and a two-species electron-ion plasma is assumed. This quantity is less than 10 volts for argon plasma at $T_e < 2$ eV. The uncertainty in determining the plasma potential due to the transition effect is small. $V_P$ may not be exactly equal to the more positive surface potential $V_{B1}$ or $V_{B2}$ at each instant because there may be a small variation in the plasma voltage, $V_P$. When the higher (or highest) surface potential at each instant is used to generate a waveform representing $V_P$, the plasma potential waveform is accurate to within a few $(\kappa T_e/e)$ volts, where $T_e$ is the plasma electron temperature, $\kappa$ is the Boltzmann constant and e is the charge of a single electron. Thus, assuming no other sources of noise, the deviation of the actual plasma voltage $V_P$ from the plasma voltage measured according to the present invention is not much larger than thermal noise. These small plasma potential deviations are insignificant because the voltages we are measuring ($V_{B1}$, $V_{B2}$ and $\Delta V(t)$, the latter being described below) are typically in the 100's or in the 1000's of volts range and the present method of determining plasma potential has an accuracy on the order of tens of volts. Therefore, this method provides a highly accurate approximation of $V_P$.

At each instant for which the $V_P$ is determined, a difference function $\Delta V$ can be calculated which represents the potential difference between the plasma and the workpiece 52 (because the workpiece 52 is assumed to have approximately the same voltage, $V_{B2}$, as the second electrode assembly 20 on which it is mounted).

$$\Delta V(t) = (V_P - V_{B2}) \qquad \text{(Equation 1)}$$

For single ion-species plasma the energy of the plasma ions striking the workpiece 52 at a particular instant can be determined utilizing the difference equation (Equation 1) as follows:

$$\text{Ion Energy} = E(t) = e\Delta V(t) = e(V_P - V_{B2}) \qquad \text{(Equation 2)}$$

where e is the magnitude of the voltage (or charge) of a single electron and $V_P$ and $V_{B2}$ are the plasma and chuck electrode voltages, respectively.

In alternate embodiments, an "n" factor can be added to the equation to account for ions that have different charges. If the concentration of each ion species is known, then one may determine a "species averaged" ion energy per the number of each type of ion specie. However, when a sampling of the charged species to identify the exact populations is not done, an assumption is made that the primary charged species are, for example, singly charged positive ions. This is generally an acceptable assumption in electropositive plasma.

Assuming the ions to respond instantaneously to changes in the potential drop across the sheath (i.e. $V_P-V_{B2}$), the most probable ion energy of the ions in the plasma striking the workpiece 52 at a given instant in time is given by equation (2). To emphasize that the ion energy is a function of time, ion energy at a given time t is represented by E(t). The differential waveform between the chuck electrode 20 voltage and the plasma voltage (that is, $V_P-VB_2$) is related to the time-dependent energy of the ions striking the workpiece 52 by equation 2. Due to the nature of the measurement of $V_{B1}$ and $V_{B2}$ as well as the estimation of $V_p$, the determination of the ion energy and IEDF assumes spatially homogeneous plasma and electrode potentials or simply represents a spatial average. (NOTE: The ion energy is a function of space, time and the species present in the plasma. Through this point, we have "integrated" over space and specie type, hence, leaving a spatially averaged, species averaged, time dependent ion energy.)

If the plasma density (and therefore the plasma current j) is constant during processing of the workpiece, the equation for ion energy E(t) (Equation 2) provides an indication of the relative amount of ion energy (or ion energy density) striking the workpiece 52 at a particular instant or over a given period of time. As described below, this information is useful when processing a workpiece. The total amount of energy of the ions striking a workpiece at a particular instant or over a given period of time can be determined utilizing the ion energy if the ion current is also known.

The optical probe 48 may optionally be used in accordance with known methods to measure, for example, the plasma density within the chamber 14. Because the time-dependent energy E(t) of the plasma ions striking the workpiece at any particular instant and the ion current j at any particular instant are determinable, the ion energy density of the ions striking the workpiece 52 at a particular instant can be determined by multiplying the ion energy (Equation (2)) by the number density of ions $n_i$ (assuming the number density of ions to be independent of time), viz.

$$\text{Total Ion Energy density} = E(t)n_i(t) = E[n_i(t)] \qquad \text{(Equation 3)}$$

wherein the number density of ions $n_i$ is related to the ion current by $J_i=0.61 \, Aen_iv_B$ (A is the substrate surface area, $v_B=(eT_e/M)^{1/2}$ is the Bohm velocity, $T_e$ is the electron temperature and M is the ion mass). The total ion energy density can be used in a manner described below in workpiece processing.

Figure 2:
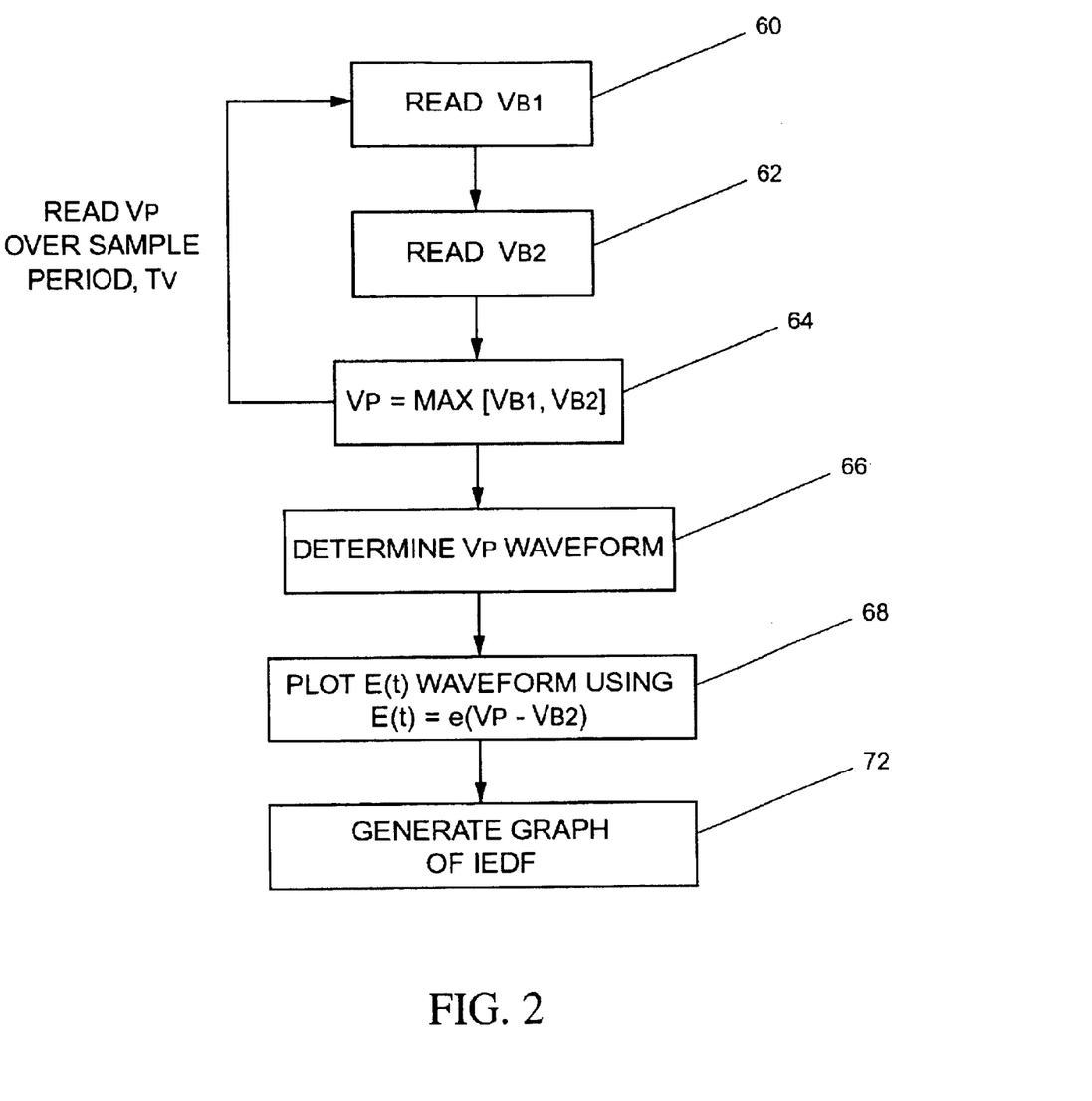
FIG. 2 shows a flowchart of operations for determining an ion energy distribution of plasma particles striking the workpiece.

The IEDF of the ions striking the workpiece over a selected bias period can be determined utilizing the ion energy as measured by E(t). First, a trace of the voltage waveform for the plasma potential voltage $V_P$ is determined. Because $V_P$ is assumed to be periodic in this example, $V_{B1}$ and $V_{B2}$ are sampled at a predetermined sample rate over a predetermined sample period to determine the shape of the $V_P$ waveform. After the waveform for $V_P$ is constructed, the waveform for E(t) is determined using equation 2. E(t) is assumed to be periodic in this example because both $V_P$ and $V_{B2}$ are periodic. E(t) is then determined or "plotted" over one period (assuming low system noise, otherwise multiple periods and averaging could be used to determine an ensemble averaged E(t)) on a graph of energy (y-axis) vs. time (x-axis). A method for determining the IEDF of the ions striking the workpiece 52 can be understood from FIGS. 1 and 2. FIG. 2 shows a flowchart of the operations a computer of the control system 50 can be programmed to perform to calculate the IEDF. The first electrode assembly voltage $V_{B1}$ is read at 60 and the chuck electrode voltage $V_{B2}$ is read at 62. The plasma voltage $V_p$ is determined at 64 by selecting the greater of $V_{B1}$ or $V_{B2}$. $V_{B1}$ and $V_{B2}$ are sampled over a sample period $T_V$ and the waveform for $V_P$ is determined at 66. The average ion energy at particular times over a sample period $T_E$ and the waveform for E(t) is determined at 68 using equation 2.

Appropriate sample periods and sample rates may be determined using known methods. For example, a sample rate and a sample period for determining E(t) can be derived from the voltage waveform for $V_P$ and the voltage waveform $V_{B2}$ for the chuck bias electrode 20. More specifically, because the voltages $V_{B1}$ and $V_{B2}$ are assumed to be sinusoidal, the chuck electrode voltage $V_{B2}$ has a frequency of $f_{VB2}$ and the first (or upper) electrode voltage $V_{B1}$ has a frequency of $f_{VB1}$. The lesser of these two frequencies is taken to be $f_{min}$ and the greater of these two frequencies is taken to be $f_{max}$. The frequency $f_{min}$ is used to determine the minimum sample period (or scan period) $T_E$ required to accurately sample the function E(t) according to the following relation:

$$T_{sample} \geq (1/f_{min}) \qquad \text{(Equation 4)}$$

For example, the sampling period $T_{sample}$ should include at least ten (10) periods at the minimum frequency $f_{min}$ (i.e. at 2 MHz, $T_{sample} \geq 5 \, \mu sec$).

Thus, $T_{sample}$ is chosen to be greater than or equal to the reciprocal of the lower (or lowest) frequency, $f_{min}$. $f_{max}$ is used to calculate the sample interval or sample rate $\Delta t$ according to the following relation:

$$\Delta t_{sample} < (\tfrac{1}{2}f_{max}) \qquad \text{(Equation 5)}$$

Thus, the sampling rate $\Delta t_{sample}$ is chosen to be less than the reciprocal of two times the higher (or highest) frequency $1/(2f_{max})$. In general, the maximum frequency is chosen to be a harmonic of the maximum applied frequency. For example, in an example plasma processing apparatus 10, the maximum frequency can be selected as the fifth harmonic of the maximum applied frequency (i.e. 5×60 MHz=300 MHz). The computer of the control system 50 can be programmed to measure the first and second electrode voltages $V_{B1}$, $V_{B2}$ (and optionally the plasma density $n_i(t)$) at a predetermined sample rate $\Delta t_{sample}$ for a sample period $T_{sample}$ (determined according to the principles described above in relation to $T_E$) and to store and process the voltage (and current) data.

Figure 3:
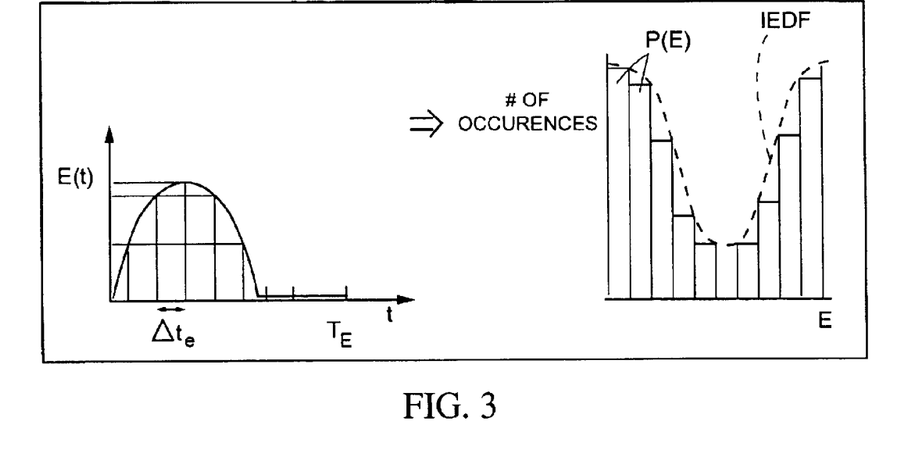
FIG. 3 shows a graph of an ion energy waveform and an ion energy distribution function.

The plasma voltage $V_P$ is calculated at 66 for each pair of sample points of $V_{B1}$ and $V_{B2}$ by comparing $V_{B1}$ and $V_{B2}$ and selecting the larger of these two measured values. If $V_P$ and $V_{B2}$ are periodic functions, then the difference equation $\Delta V(t)$ and E(t) are periodic as well. Assuming plasma processing system noise is low, the IEDF can be calculated over one period of E(t) (or ensemble averaged over one time period). FIG. 3 indicates at 72 (FIG. 2) that one wave period of E(t) plotted on a graph of energy versus time can be used to generate the IEDF. The wave period of E(t) is divided into intervals $\Delta t_e$. The energy level associated with each $\Delta t_e$ interval can be determined from the y axis. The number of occurrences of various energy level ranges during the wave period are plotted on a graph on the right hand side of FIG. 3. An IEDF can be generated from the relative number of occurrences (indicated by a bar graph as shown to the right in FIG. 3) versus energy level (E) data as indicated at 72 in FIG. 2. The number of occurrences of each energy level (E) is indicated by the height of each bar and corresponds to the probability of the occurrence of each energy level (E) during the wave period. The bars are labeled P(E) in FIG. 3. The data indicating number of occurrences of each energy range or level can optionally be normalized by the total number of data points to make comparisons with other frequency combinations (of $V_{B1}$ and $V_{B2}$, for example) easier.

The IEDF curve is superimposed on the graph at 72. The IEDF is a description of the energy of the ions striking the workpiece 52 during a given voltage period. The density $n_i(t)$ can be determined by the control system 50 to determine whether plasma density remains constant and/or to calculate total energy if desired.

In an alternate embodiment, process 66 further includes filtering the plasma potential $V_P$ and the chuck electrode voltage $V_{B2}$ prior to process 68. Each (periodic) time varying signal is transformed into frequency space via a Fourier transform using techniques described in, for example, *Numerical Recipes,* Press et al., Cambridge University Press, Cambridge, 1989, Ch. 12, pp. 381–453. Once a time varying signal is transformed into Fourier space, it can be multiplied by a filter function and then inverse Fourier transformed back into time-space, hence, producing a digitally filtered signal. The filter function can include high-pass, low-pass or narrow-pass filters. Preferably, a low-pass filter is used to remove high frequency content from $V_p(t)$, $V_{B2}(t)$ or preferably $\Delta V(t)$. Due to the relatively large inertia for ions, they have negligible response to changes in the electric field at very high frequency. For example, a first cut-off frequency can be the ion plasma frequency $\omega_{pi} = (e^2 n_i / \epsilon_0 M)^{1/2}$, where $\epsilon_0$ is the permittivity of free space. A second cut-off frequency can be determined from the ion transit time across the plasma sheath at the upper surface of the substrate, viz. $\omega = 2\pi \omega_{pi} (T_e / 2\Delta V)^{1/2}$, where $\Delta V$ is the mean potential difference across the sheath and the sheath thickness is determined using the "matrix sheath" model on page 164 of Lieberman & Lichtenberg, *Principles of Plasma Discharges and Materials Processing,* John Wiley & Sons, Inc., New York, 1994. Therefore, in the latter case, use of an iterative scheme is required by one of ordinary skill in the art to determine a cut-off frequency. Furthermore, since there exists a distribution of ions through the sheath, the filter function should have a "smoothly" varying shape at the cut-off frequency rather than a "sharply" varying shape at the filter edge.

Although the example plasma processing system 12 of FIG. 1 includes only two electrodes, this is illustrative only and is not intended to limit the scope of the present invention. Plasma ion energy may be calculated according to the principles of the invention when any number of electrodes is included in the plasma processing system 12. For example, a plurality of other electrodes in addition to the first electrode assembly 18 could be mounted in the chamber 16 and a respective voltage signal electrically communicated to each additional electrode. In this instance, the plasma potential $V_P$ may be calculated by determining simultaneously the voltage of each electrode having a plasma engaging surface that is substantially in contact with the plasma within the plasma processing system (i.e., determining the voltage of the first electrode assembly 18, the voltage of the second electrode assembly 20 and the voltage of each of the other electrodes in the chamber) at appropriate time intervals for an appropriate sample period. The plasma voltage $V_P$ may then be determined at each sample point during the sample period by selecting the greatest voltage of all the electrode voltages of the plasma processing system. Once $V_P$ is determined, $E(t)$, $n_i(t)$ and $E(t)n_i(t)$ may be calculated for the system as described above for the two electrode plasma processing system 12. A plurality of electrodes on the first side of the chamber 14 may be provided by a segmented electrode, for example.

The ion energy $E(t)$, the average total ion energy density $E(t)n_i(t)$ and the IEDF can be used during workpiece processing to improve quality and yield of product during manufacturing. The ion energy $E(t)$ and the average total ion energy density $E(t)n_i(t)$ provide information on the relative and total amounts of energy, respectively, acting on the workpiece during etching or during the deposition of materials on a workpiece. The IEDF provides an indication of the relative energies and distributions of populations of ions striking the workpiece during processing. For example, the graph of the IEDF in FIG. 3 created at 72 in FIG. 2, for example, shows that a population of relatively low energy ions and a population of relatively high energy ions strike the workpiece during each period of $E(t)$.

When the workpiece 52 comprises semiconductor devices, the IEDF information can be used to improve semiconductor device quality and yield. For example, the IEDF information can be used when etching a pattern in (or depositing a material in or on) a surface of a wafer of semiconductor material to allow the manufacturer to select an appropriate energy wave for a particular semiconductor material and a particular semiconductor etching (or deposition) application. The determination of the optimal energy waveform for a particular application can be done experimentally. That is, a particular waveform can be used to process a particular type of workpiece and the results examined. The quality of the results of the etching/deposition can be correlated with or examined in light of the energy waveform of the ion current used in the etching/deposition process. If damage to the workpiece occurs, for example, the waveform can be changed to, for example, change the shape of the waveform and/or reduce the size and/or distribution of relative peaks of the waveform, and so on.

Moreover, monitoring the time-dependent ion energy and, more specifically, the IEDF, an operator can be alerted to "less than optimal" performance for the plasma processing apparatus. For example, when the IEDF sufficiently deviates from the "known" IEDF for a specific process, an alarm can be triggered for the operator. When the root mean square deviation from the "known" (measured a priori) IEDF to the measured IEDF exceeds 20% of the mean ion energy, then the operator (either the fab operator and/or equipment supplier) is notified. The computer processor 50 can be connected via an integrated circuit (IC) manufacturing plant intranet to a centralized plant server for notification of a fab operator and/or an equipment supplier server located in the fab through which notification can be sent to the equipment supplier off-site via the internet.

It will also be understood that while the electrodes of a processing chamber were described as each being driven by an associated voltage source, this does not imply that each electrode has to be driven by the associated voltage source. Thus, for example, it is possible for one or the other of the pair of electrodes 18, 20 of the system 10 to be constantly at ground level or at any other static (i.e., unchanging) voltage level during processing.

The many features and advantages of the present invention are apparent from the detailed specification and thus, it is intended by the appended claims to cover all such features and advantages of the described method which follow in the true spirit and scope of the invention. Further, since numerous modifications and changes will readily occur to those of ordinary skill in the art, it is not desired to limit the invention to the exact construction and operation illustrated and described. Moreover, the method and apparatus of the present invention, like related apparatus and methods used in the semiconductor arts that are complex in nature, are often best practiced by empirically determining the appropriate values of the operating parameters, or by conducting computer simulations to arrive at best design for a given application. Accordingly, all suitable modifications and equivalents should be considered as falling within the spirit and scope of the invention.

What is claimed is:

1. A plasma processing system for processing a workpiece, the plasma processing system comprising:
   a plasma chamber including an interior region for supporting a plasma;
   at least one electrode assembly mounted within said plasma chamber;
   at least one RF power source electrically coupled to said at least one electrode assembly through at least one transmission line;
   at least one voltage probe coupled to said at least one transmission line and configured to measure a voltage at said at least one electrode assembly; and
   a control system electrically coupled to said at least one voltage probe, and said at least one RF power source, the control system being configured to determine an ion energy of plasma ions striking the workpiece over a voltage bias period to improve the performance of the plasma processing system.

2. The plasma processing system as recited in claim 1, wherein said control system is further configured to determine an ion energy distribution function (IEDF) of plasma ions striking the workpiece over a voltage bias period to improve the performance of the plasma processing system.

3. The plasma processing system as recited in claim 1, wherein said at least one electrode assembly comprises a first electrode assembly and a second electrode assembly, wherein said first electrode assembly is mounted on a first side of the plasma chamber and said second electrode assembly is mounted on a second side of the plasma chamber opposite the first side of the plasma chamber and spaced from the first electrode assembly.

4. The plasma processing system as recited in claim 3, wherein said first electrode assembly and said second electrode assembly comprise a plurality of electrode segments, each segment being electrically isolated from the other segments and at least two segments being independently powered by an associated RF power source for transmission of RF power into the interior of the plasma chamber.

5. The plasma processing system as recited in claim 3, wherein said first electrode assembly and said second electrode assembly comprise a plurality of electrode segments, at least two segments being independently supplied with a selected processing gas for transmission into the interior of the plasma chamber.

6. The plasma processing system as recited in claim 1, wherein said plasma processing system further comprises an optical probe coupled to the plasma chamber and to the control system, the optical probe being configured to determine plasma characteristics and conditions based on spectral and optical properties of the plasma.

7. The plasma processing system as recited in claim 1, wherein the at least one electrode assembly comprises at least one of a grounded chamber wall, a grounded electrode assembly, a DC biased electrode assembly, an AC biased electrode assembly, a DC biased chamber wall, and an AC biased chamber wall.

8. A method for determining the potential of a plasma generated in a plasma chamber utilizing at least one electrode assembly disposed in said plasma chamber, comprising:

a) applying at least one signal to the at least one electrode assembly;

b) measuring at least one voltage, wherein said measuring at least one voltage comprises determining a measured voltage for each plasma engaging surface;

c) determining a highest measured voltage by comparing the measured voltages corresponding to plasma engaging surfaces; and d) equating the highest measured voltage to the plasma potential, the plasma potential at a particular instant in time being equal to the highest measured voltage observed for any of the plasma engaging surfaces that are interacting with the plasma at the particular instant.

9. The method for determining the potential of a plasma as recited in claim 8, said at least one electrode assembly comprising first and second electrode assemblies, said measuring at least one voltage comprising determining a first measured voltage corresponding to the plasma engaging surface of the first electrode assembly and a second measured voltage corresponding to the plasma engaging surface of the second electrode assembly, and the method further comprising equating the plasma potential to the more positive voltage of the first measured voltage and the second measured voltage.

10. The method for determining the potential of a plasma as recited in claim 8, said measuring further comprising measuring voltages at points in time; said determining the highest voltage further comprising determining a highest measured voltage at each point in time; said equating further comprising equating the highest measured voltage to the plasma potential at each point in time; and the method further comprising generating a waveform representing the plasma potential at each point in time.

11. A method for determining the energy of a plasma ion current striking a workpiece in a processing chamber, and the plasma being biased by a plurality of electrodes in the chamber, one said electrode supporting the workpiece, a respective voltage signal being electrically communicated to each said electrode, the method comprising:
   determining the voltage of a plasma engaging surface of each electrode of said plurality of electrodes at sample points for a period of time;
   determining a maximum electrode voltage during each sample point for each of said plurality of electrodes;
   determining a waveform representing the plasma potential for the period of time, the waveform being determined utilizing the maximum electrode voltage of each of said plurality of electrodes measured during each sample point; and
   determining the ion energy of the ion current striking the workpiece.

12. The method for determining the energy of a plasma ion current as recited in claim 11, wherein the period of time is equal to the period when the plasma is being biased by the plurality of electrodes in the chamber.

13. The method for determining the energy of a plasma ion current as recited in claim 11, wherein the period of time is less than the period when the plasma is being biased by the plurality of electrodes in the chamber.

14. The method for determining the energy of a plasma ion current as recited in claim 11, wherein the period of time is more than the period when the plasma is being biased by the plurality of electrodes in the chamber.

15. The method for determining the energy of a plasma ion current as recited in claim 11, wherein said determining the ion energy comprises calculating a difference function at each sample point where the difference function is the difference between the plasma potential and the potential of the one said electrode supporting the workpiece; and determining an ion energy using the product of the voltage difference value and the charge on an electron at each sample point, wherein the determination of the ion energy assumes a spatially homogeneous plasma.

16. The method for determining the energy of a plasma ion current as recited in claim 11, wherein the method further comprises determining a total amount of energy of the ions striking the workpiece in said period of time.

17. The method for determining the energy of a plasma ion current as recited in claim 11, wherein determining a total amount of energy comprises determining an ion current; and multiplying the ion energy by the number density of ions $n_i$ wherein $n_i$ is related to the ion current by $J_i=0.61 Aen_iv_B$, wherein A is the substrate surface area, $v_B=(eT_e/M)^{1/2}$ is the Bohm velocity, $T_e$ is the electron temperature and M is the ion mass.

18. The method for determining the energy of a plasma ion current as recited in claim 16, further comprising determining the ion energy distribution function (IDEF) of the ion current striking the workpiece.

19. The method for determining the energy of a plasma ion current as recited in claim 18, wherein the determining of the ion energy distribution function comprises constructing a waveform of the plasma potential, constructing a waveform for the ion energy; and determining an ensemble averaged E(t) using a graph of energy (y-axis) vs. time (x-axis).

20. A machine readable medium encoded with a program for determining an ion energy distribution function of a plasma contained in a chamber using a processing system, at least two electrodes being mounted in said chamber, one electrode of said at least two electrodes supporting a workpiece, each electrode having a plasma engaging surface in contact with said plasma and each electrode being electrically communicated to a respective voltage signal, said program causing said processing system to:

determine the voltages of the respective plasma engaging surfaces of each electrode at a predetermined sample rate for a predetermined sample period to provide samples of said voltages at sample points during said sample period;

determine the plasma potential at each said sample point by selecting the greatest electrode voltage;

determine a plasma potential waveform for said plasma utilizing said sampled plasma potentials;

determine an ion energy waveform of said plasma utilizing the plasma potential waveform; and determine the ion energy distribution function of said plasma utilizing the ion energy waveform.

21. A method for determining the potential of a plasma generated in a plasma chamber utilizing at least one electrode assembly disposed in said plasma chamber, wherein said plasma chamber comprises a plasma engaging surface having a measured voltage of ground potential, the method comprising:

a) applying at least one signal to the at least one electrode assembly;

b) measuring at least one voltage, wherein said measuring at least one voltage comprises determining a measured voltage for each of said at least one electrode assembly that comprises a plasma engaging surface;

c) determining a highest measured voltage by comparing the measured voltages corresponding to plasma engaging surfaces; and d) equating the highest measured voltage to the plasma potential, the plasma potential at a particular instant in time being equal to the highest measured voltage observed for any of the plasma engaging surfaces that are interacting with the plasma at the particular instant.

22. A method for determining the potential of a plasma generated in a plasma chamber utilizing at least one plasma engaging surface, the method comprising:

a.) measuring at least one voltage, wherein said measuring at least one voltage comprises determining a measured voltage for each of the at least one plasma engaging surface;

b.) determining a highest measured voltage by comparing the measured voltage corresponding to each of the at least one plasma engaging surface; and c.) equating the highest measured voltage to the plasma potential, the plasma potential at a particular instant in time being equal to the highest measured voltage observed for any of the at least one plasma engaging surfaces that are interacting with the plasma at the particular instant.

23. A method for determining the potential of a plasma as recited in claim 22, wherein the at least one plasma engaging surface comprises at least one of a grounded chamber wall, a grounded electrode assembly, a DC biased electrode assembly, an AC biased electrode assembly, a DC biased chamber wall, and an AC biased chamber wall.

* * * * *